United States Patent
Park et al.

(10) Patent No.: US 6,885,710 B1
(45) Date of Patent: Apr. 26, 2005

(54) APPARATUS AND METHOD FOR CHANNEL ENCODING/DECODING IN A COMMUNICATION SYSTEM

(75) Inventors: Chang-Soo Park, Seoul (KR); Hyeon-Woo Lee, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/294,659

(22) Filed: Apr. 19, 1999

(30) Foreign Application Priority Data

Apr. 18, 1998 (KR) .............................. 98-13957

(51) Int. Cl.⁷ .............................. H04L 27/06
(52) U.S. Cl. .................. 375/340; 375/262; 375/265; 714/751; 714/796
(58) Field of Search .................. 375/340, 136, 375/262, 265; 714/746, 774, 793, 796, 751, 752

(56) References Cited

U.S. PATENT DOCUMENTS

| | | | |
|---|---|---|---|
| 5,761,248 A | * | 6/1998 | Hagenauer et al. .......... 375/340 |
| 6,189,123 B1 | * | 2/2001 | Anders Nystrom et al. 714/751 |
| 6,192,503 B1 | * | 2/2001 | Chennakeshu et al. ..... 714/796 |
| 6,252,917 B1 | * | 6/2001 | Freeman ..................... 375/340 |
| 6,377,610 B1 | * | 4/2002 | Hagenauer et al. .......... 375/136 |

FOREIGN PATENT DOCUMENTS

| | | |
|---|---|---|
| JP | 11-330984 | 11/1999 |
| WO | WO99/12265 | 3/1999 |

OTHER PUBLICATIONS

English language Abstract of Japanese Laid–Open Patent Application No. 11–191758, dated Jul. 13, 1999.

* cited by examiner

Primary Examiner—Shuwang Liu
(74) Attorney, Agent, or Firm—Dilworth & Barrese, LLP

(57) ABSTRACT

An apparatus and method for channel encoding/decoding are provided which vary an iterative decoding number according to service type, data class and channel condition. A message information receiver receives information about a message to be received. A controller determines an iterative decoding number according to the message information received. A decoder iteratively decodes the received message according to the determined iterative decoding number. The message information includes a class of received data, and the class includes a bit error rate (BER). The iterative decoding number is increased for a low BER as compared to a predetermined BER. Further, the class includes a permissible time delay, and the iterative decoding number is increased for a long permissible time delay as compared to a predetermined permissible time delay. In addition, the message information includes a service type of the received data, and the iterative decoding number is decreased when the service type is a moving picture service.

20 Claims, 7 Drawing Sheets

US 6,885,710 B1

APPARATUS AND METHOD FOR CHANNEL ENCODING/DECODING IN A COMMUNICATION SYSTEM

PRIORITY

This application claims priority to an application entitled "Channel Encoding/Decoding Apparatus and Method For Communication System" filed in the Korean Industrial Property Office on Apr. 18, 1998 and assigned Serial No. 98-13957, the contents of which are hereby incorporated by reference.

BACKGROUND

1. Field of the Invention

The present invention relates generally to a communication system, and more particularly, to an apparatus and method for channel encoding/decoding for performing soft-decision iterative decoding in a communication system.

2. Description of the Related Art

A turbo encoder is a typical channel encoder which supports iterative decoding. The turbo encoder is classified into a parallel turbo encoder and a serial turbo encoder. Although the present invention will be described with reference to the parallel turbo encoder, it is also possible to apply the present invention to the serial turbo encoder interworking with an iterative decoding apparatus.

The turbo encoder encodes an N-bits input data frame into parity symbols using two simple parallel concatenated codes, wherein recursive systematic convolutional (RSC) codes are generally used for component codes. FIGS. 1 and 2 illustrate a prior art turbo encoder and decoder, respectively. The encoder and decoder are disclosed in U.S. Pat. No. 5,446,747 issued on Aug. 29, 1995, the contents of which are incorporated herein by reference.

Referring to FIG. 1, an interleaver 16 is connected between first and second constituent encoders 12 and 14. For the first and second encoders 12 and 14, a RSC encoder may be used, which is well-known in the art. The interleaver 16 has the same size as a frame length, N, of the input data, and changes arrangement of the input data bit-stream $d_k$ provided to the second constituent encoder 14 to decrease the correlation among the data bits. Therefore, the output parallel concatenated codes for the input data bit-stream $d_k$ become $x_k$ (i.e., $d_k$ without modification), $y_{1k}$, and $y_{2k}$.

FIG. 2 is a block diagram showing a configuration of a conventional turbo decoder. The turbo decoder includes an adder 18, subtracters 20 and 22, a soft-decision circuit 24, delays 26, 28 and 30, and MAP (Maximum A Posteriori Probability) decoders 32 and 34. The turbo decoder further includes an interleaver 36 which is identical to the interleaver 16 shown in FIG. 1, and deinterleavers 38 and 40. The turbo decoder iteratively decodes input data in the frame unit using a MAP decoding algorithm; a bit error rate (BER) is decreased, as the iterative decoding number increases. A SOVA (Soft Output Viterbi Algorithm) decoder which can perform soft-decision iterative decoding can also be used for the turbo decoder.

As illustrated in FIG. 1, the turbo encoder includes the interleaver 16, which implies that encoding and decoding should be performed in the frame unit. Therefore, it can be understood that the required memory capacity for the MAP decoders 32 and 34 in the turbo decoder of FIG. 2 increases in proportion to a value obtained by multiplying the frame length by a status number of the encoders 12 and 14 of FIG. 1.

In a communication system for providing various services, such as voice, character, image and moving picture services, a data rate ranges from several Kbps to several Mbps, and a length of data frames inputted to a channel encoder varies from several ms (milliseconds) to several hundred ms. In particular, a channel decoder employing the iterative decoding, such as the turbo decoder, experiences a decreased bit error rate (BER) as the number of iterative decodings increases. However, an increase in the iterative decoding number inevitably leads to an increase in the amount of calculations, power consumed by the decoder, and transmission time. Hence, in the channel decoder using iterative decoding, the iterative decoding number is generally fixed to a value satisfying a permissible time delay irrespective of the service type.

However, since the condition of a transmission channel varies with time, a desired bit error rate may not be obtained with the fixed iterative decoding number when the condition of the receiving channel is worse as compared to a predetermined condition. In a packet data service which may be less influenced by a transmission time delay, a desired bit error rate may be satisfied by increasing the iterative decoding number. However, when the iterative decoding number is fixed to a maximum value in consideration of only the worst channel condition, the amount of calculations unnecessarily increases, causing an increase in power consumption of the decoder in a good channel condition. Further, even though the transmission delay time increases, it is needed to increase the iterative decoding number, if necessary, according to a class of the user or received data. The bit error rate and the time delay are determined according to the class. Therefore, it is necessary to vary the iterative decoding number according to the service type, the class, and the channel conditions.

SUMMARY

It is, therefore, an object of the present invention to provide a channel encoding/decoding apparatus and method for varying an iterative decoding number according to a service type and a data class.

It is another object of the present invention to provide a channel encoding/decoding apparatus for varying an iterative decoding number according to a channel condition as a function of time.

The present invention provides a receiving device for a communication system. In the receiving device, a message information receiver receives information about a message to be received. A controller determines an iterative decoding number of a decoder according to the message information received. A decoder iteratively decodes the received message according to the determined iterative decoding number.

The message information includes a class of received data, and the class includes a required bit error rate (BER). The iterative decoding number is increased for a low BER as compared to a predetermined threshold. Further, the class includes a permissible time delay, and the iterative decoding number is increased for a long permissible time delay as compared to a predetermined threshold. In addition, the message information includes a service type of the received data, and the iterative decoding number is decreased when the service type is a moving picture service.

DETAILED DESCRIPTION OF PREFERRED EMBODIMENTS

Preferred embodiments of the present invention will be described hereinbelow with reference to the accompanying drawings. In the following description, well known constructions or functions are not described in detail so as not to obscure the present invention.

In a preferred embodiment of the present invention, a turbo encoder is used for a channel encoder, and a MAP decoder is used for soft-decision iterative decoding. A SOVA decoder can also be used for the soft-decision iterative decoding.

Figure 1:
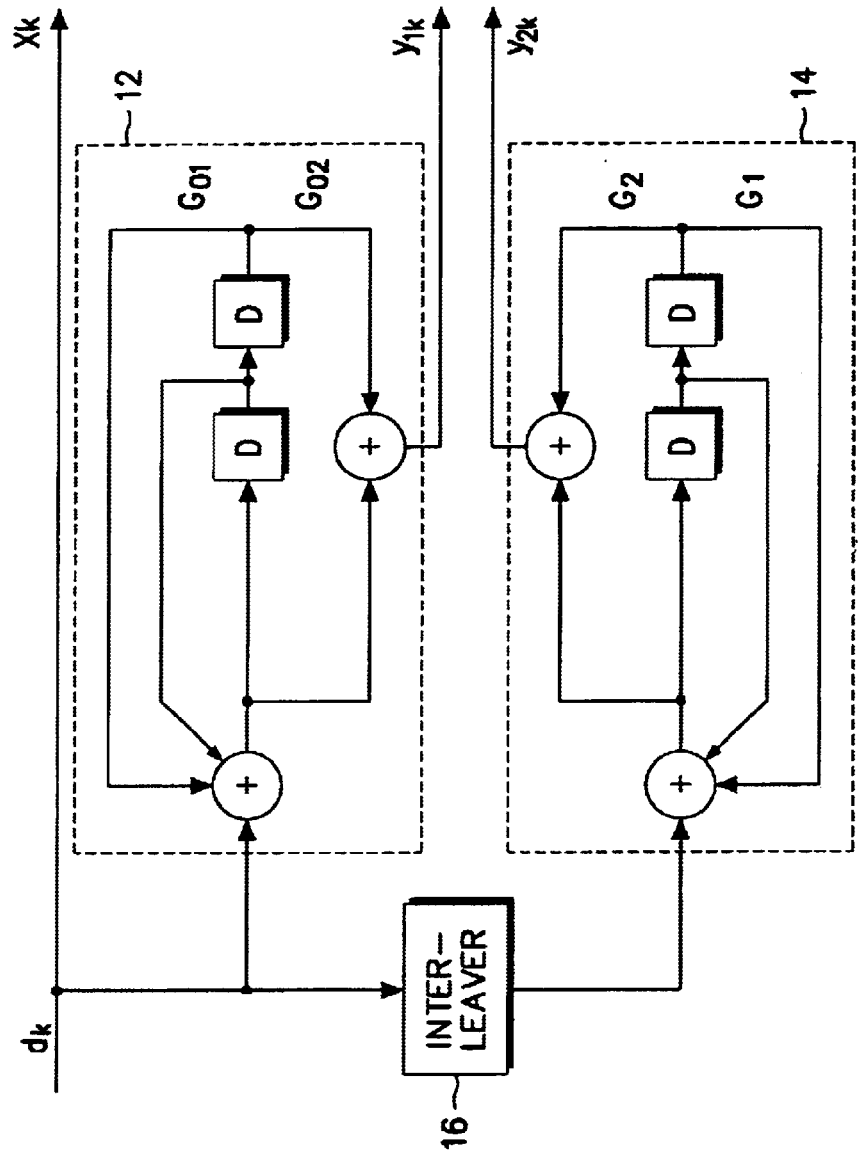
FIG. 1 is a block diagram illustrating a prior art turbo encoder.
Figure 2:
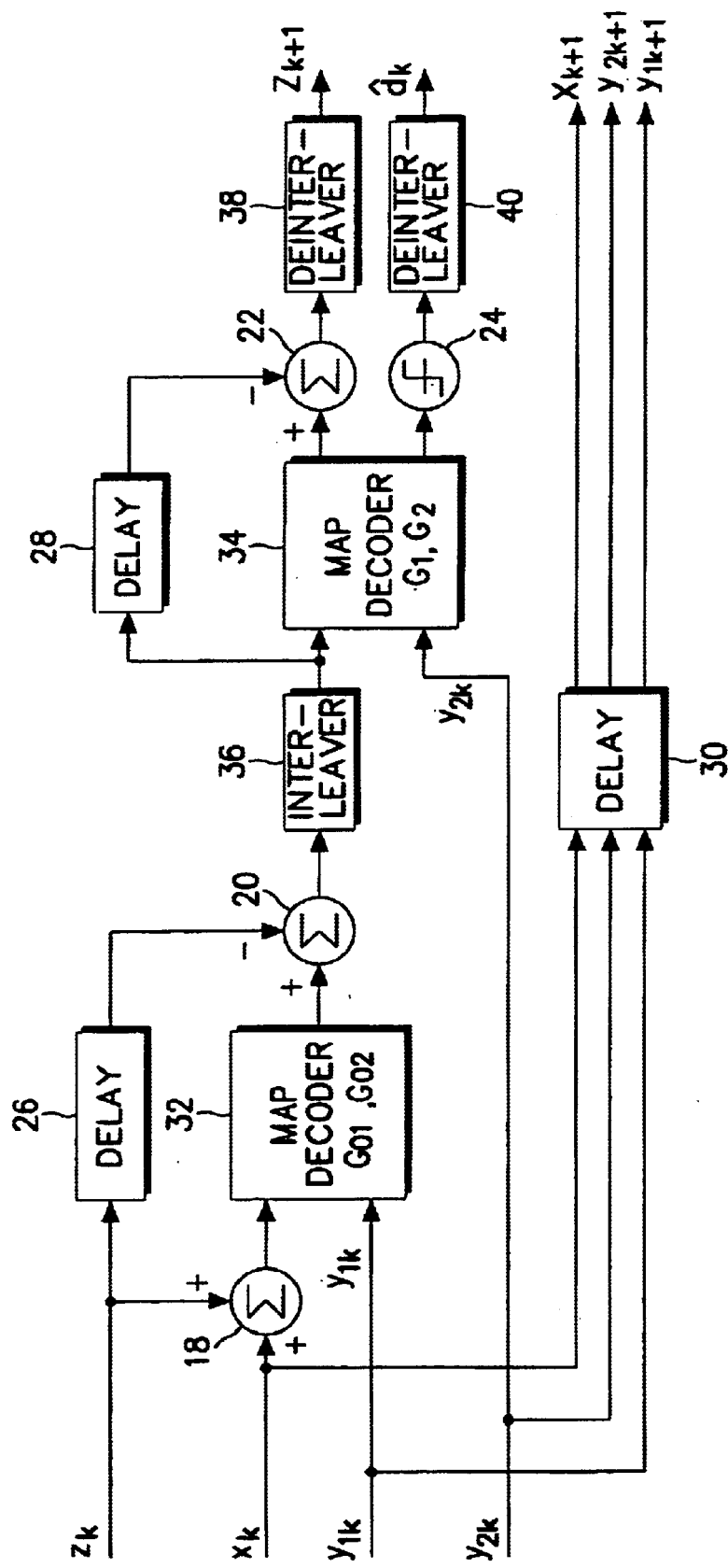
FIG. 2 is a block diagram illustrating a prior art turbo decoder.
Figure 3:
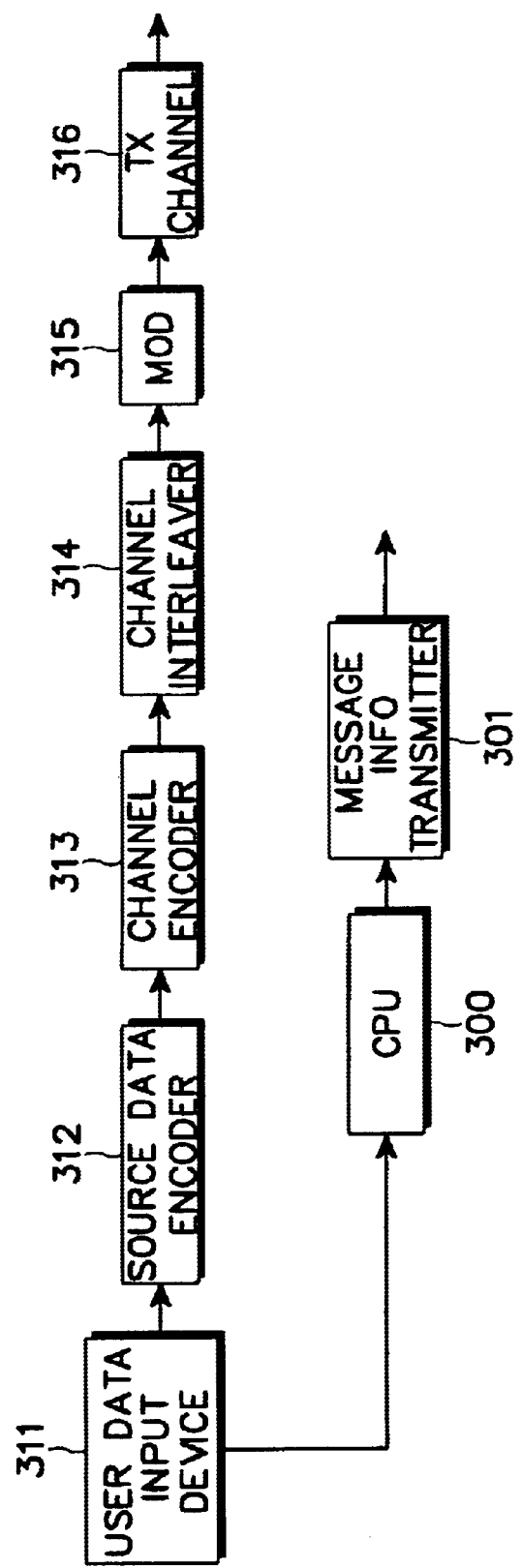
FIG. 3 is a block diagram illustrating a channel transmitter according to an embodiment of the present invention.

FIG. 3 illustrates a channel transmitter including a turbo channel encoder according to an embodiment of the present invention. The turbo channel encoder turbo encodes user data received in a unit of N-bits input frame and transmits the encoded user data over a transmission channel.

A source data encoder 312 compresses and encodes user data provided from a user data input device 311. A channel encoder 313 encodes an output of the source data encoder 312. In the embodiment, a turbo encoder is used for the channel encoder 313. A channel interleaver 314 interleaves an output of the channel encoder 313. A modulator 315 modulates (or spreads) an output of the interleaver 314 and transmits the modulated output over a transmission channel 316. A central processing unit (CPU) 300 determines a service type (voice, character, image, or moving picture service) and a data class, and provides message information about the service type and data class to a message information transmitter 301. The data class includes the required bit error rate (BER) and the permissible time delay. The data class and service type can be determined during call setup or during on service.

In operation, upon receipt of the user data from the user data input device 311, the source data encoder 312 encodes the user data and provides the encoded data to the channel encoder 313. The user data may be character, image or moving picture data having a data rate of several tens of Kbps or more, or voice data having a data rate of several Kbps. The CPU 300 transmits message information about the service type and the class of the user data through the message information transmitter 301.

Although the present invention is described with reference to an embodiment which transmits the message information to the decoder via a separate channel, it is also contemplated to transmit the message information by carrying it on a head or tail area of a transmission frame during transmission of the user data.

Figure 4:
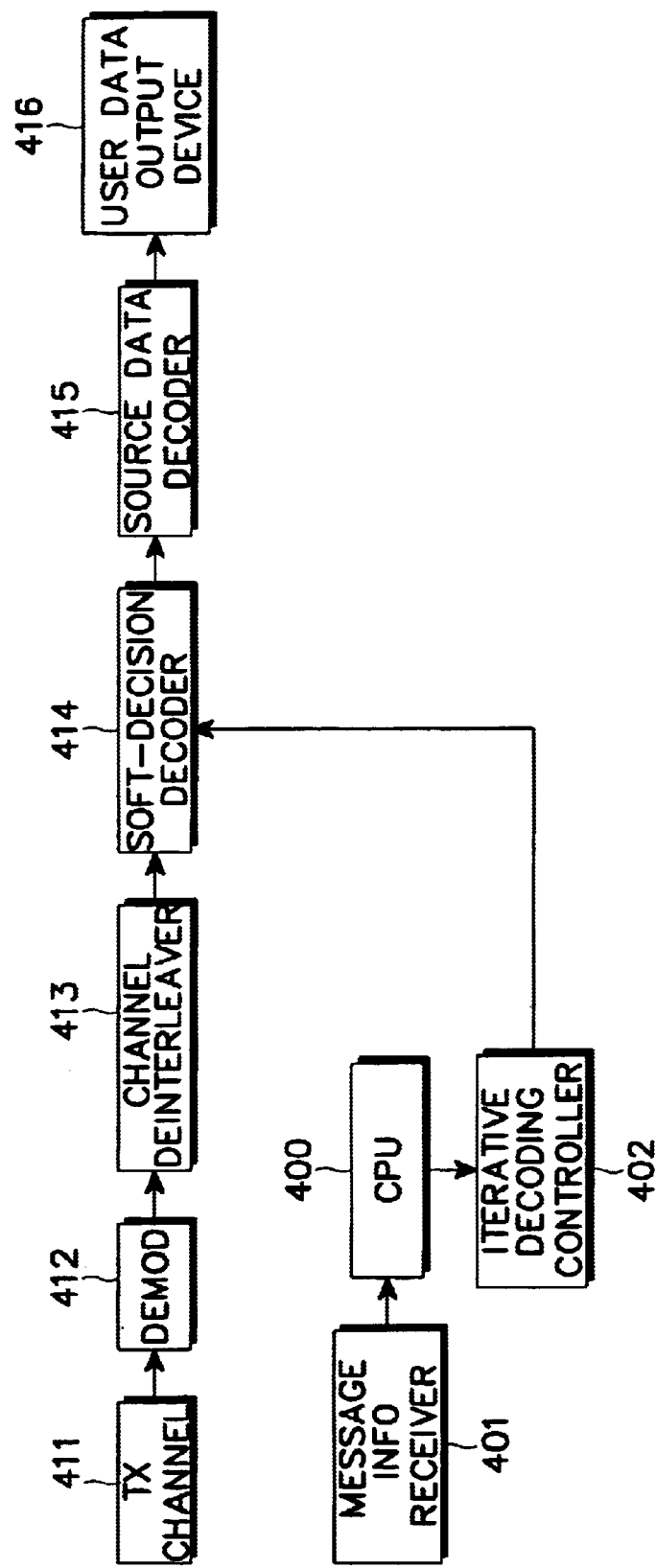
FIG. 4 is a block diagram illustrating a channel receiver according to a first embodiment of the present invention.

FIG. 4 illustrates a channel receiver including a channel decoder in accordance with a first embodiment. A demodulator 412 demodulates an input signal received via a transmission channel 411. A channel deinterleaver 413 deinterleaves an output of the demodulator 412. A message information receiver 401 receives the message information transmitted from the message information transmitter 301 of FIG. 3, and provides it to a CPU 400. The CPU 400 analyzes the received message information and provides information about iterative decoding to an iterative decoding controller 402. The iterative decoding controller 402 then analyzes the iterative decoding information provided from the CPU 400 to determine the iterative decoding number according to the analysis, and controls the soft-decision decoder 414 according to the determined iterative decoding number. Here, the iterative decoding number is decreased for a moving picture service permitting only a short time delay, and increased for a character service permitting even a longer time delay. In addition, even while decoding, if the BER or FER (Frame Error Rate) is higher than a threshold, the iterative decoding number is increased. The soft-decision decoder 414 iteratively decodes an output of the channel deinterleaver 413 under the control of the iterative decoding controller 402. A MAP or SOVA decoder may be used for the soft-decision decoder 414. A source data decoder 415 decodes an output of the soft-decision decoder 414 and provides the decoded output to a user data output device 416.

The message information includes the service type (voice, character, image and moving picture service) and the data class, as previously stated. The data class includes the required BER and the permissible time delay. This message information is used to determine the iterative decoding number. For a lower BER or a longer permissible time delay, the iterative decoding controller 402 increases the iterative decoding number.

The channel decoder 414 iteratively decodes the user data according to the iterative decoding number control signal provided from the iterative decoding controller 402. Upon receiving the frame data through the transmission channel 411, the demodulator 412 demodulates the received data and supplies the demodulated data to the channel deinterleaver 413. The channel deinterleaver 413 deinterleaves the demodulated data and provides the deinterleaved data to the decoder 414. At this moment, the message information receiver 401 receives the message information about the service type and the data class transmitted from the message information transmitter 301 of FIG. 3 via the transmission channel and provides the received message information to the CPU 400.

The CPU 400 then analyzes the message information and provides information about iterative decoding to the iterative decoding controller 402. The iterative decoding controller 402 analyzes the information about the iterative decoding to determine the iterative decoding number. Based on the determination results, the iterative decoding controller 402 varies the iterative decoding number of the soft-decision decoder 414, when necessary. The soft-decision decoder 414 iteratively decodes the output of the channel deinterleaver 413 according to the iterative decoding number control signal provided from the iterative decoding controller 402. The CPU 400 controls timing of the entire decoding process according to a variation in the iterative decoding number. The output of the soft-decision decoder 414 is inputted to the user data output device 416 via the source data decoder 415.

Figure 5:
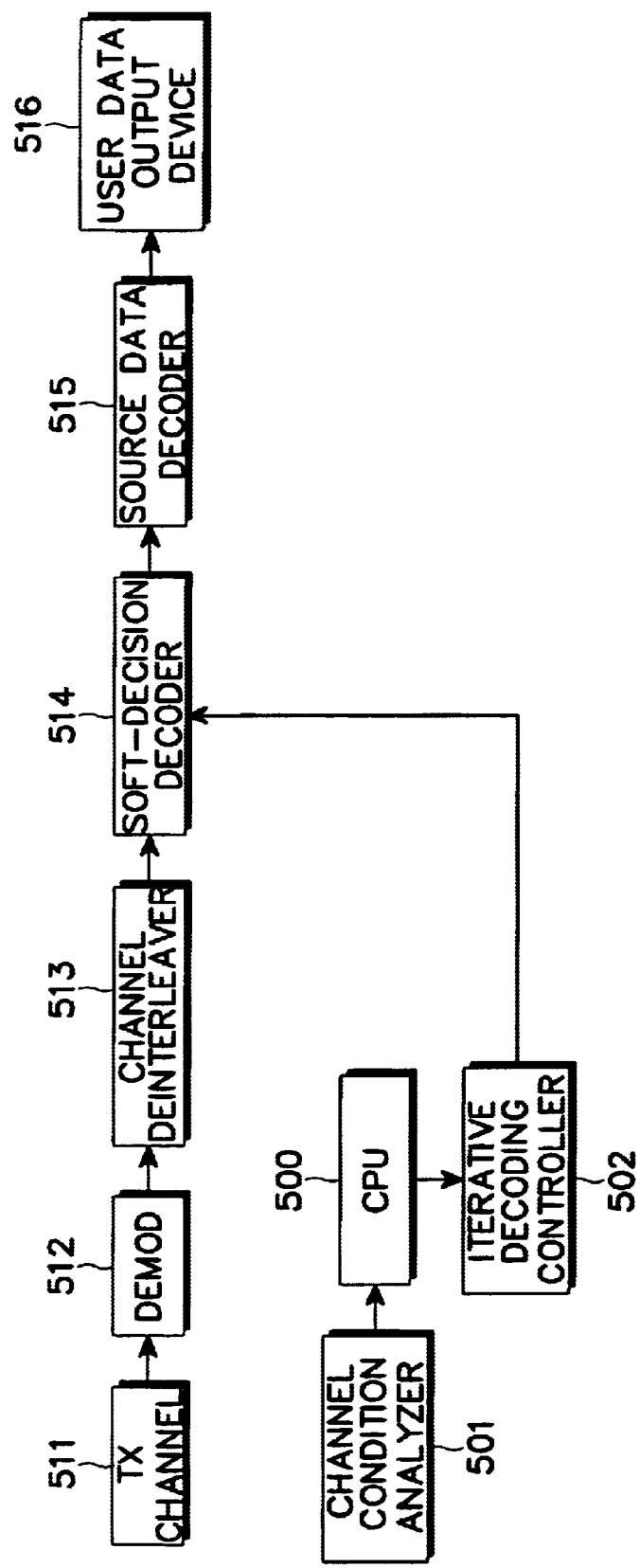
FIG. 5 is a block diagram illustrating a channel receiver according to a second embodiment of the present invention.

FIG. 5 illustrates a second embodiment of a channel receiver including a channel decoder according to the present invention. Referring to FIG. 5, the channel receiver does not include the message information transmitter 401 of FIG. 4. However, the channel receiver can be separately provided with the message information about the service type and data class from the transmitter.

In the channel receiver of FIG. 5, a channel condition analyzer 501 varies the iterative decoding number of a soft-decision decoder 514 according to the channel condition over time. The channel condition is compared to a predetermined channel condition and the iterative decoding number is adjusted accordingly. For example, in a CDMA communication system, when a base station exchanges data with multiple mobile stations, the base station provides the respective mobile stations with an interference level signal among reverse channel signals received from the mobile stations on a broadcasting channel. This interference level signal is used for channel condition in a mobile station. Alternatively, the mobile stations can determine the channel condition by analyzing a pilot signal transmitted from the base station to measure a signal-to-interference ratio (SIR) of the signal.

A demodulator 512 demodulates an input signal received through a transmission channel 511. A channel deinterleaver 513 deinterleaves an output of the demodulator 512. The channel condition analyzer 501 analyzes a channel condition by measuring a signal-to-interference ratio (SIR) and provides the analysis results to a CPU 500. The CPU 500 provides information about iterative decoding to an iterative decoding controller 502. The iterative decoding controller 502 then controls the iterative decoding number of the soft-decision decoder 514. The iterative decoding controller 502 analyzes the information about the iterative decoding to determine whether it is needed to vary the present iterative decoding number.

The soft-decision decoder 514 iteratively decodes an output of the channel deinterleaver 513 under the control of the iterative decoding controller 502. The MAP or SOVA decoder may be used for the soft-decision decoder 514. A source data decoder 515 decodes an output of the soft-decision decoder 514 and provides the decoded output to a user data output device 516.

In operation, the channel condition analyzer 501 measures the SIR using an interference level control signal and a pilot signal transmitted from the base station and provides the measured SIR to the CPU 500. The CPU 500 provides information about iterative decoding to the iterative decoding controller 502. The iterative decoding controller 502 analyzes the information about the channel condition and determines whether to vary the present iterative decoding number of the soft-decision decoder 514.

For example, the iterative decoding controller 502 decreases the iterative decoding number when the condition of the transmission channel is better than a threshold or a predetermined number. The soft-decision decoder 514 decodes the output of the channel deinterleaver 513 according to the iterative decoding number control signal from the iterative decoding controller 502. The controller 500 controls timing of the entire decoding process based on a variation in the iterative decoding number. The output of the soft-decision decoder 514 is inputted to the user data output device 516 via the source data decoder 515.

Figure 6:
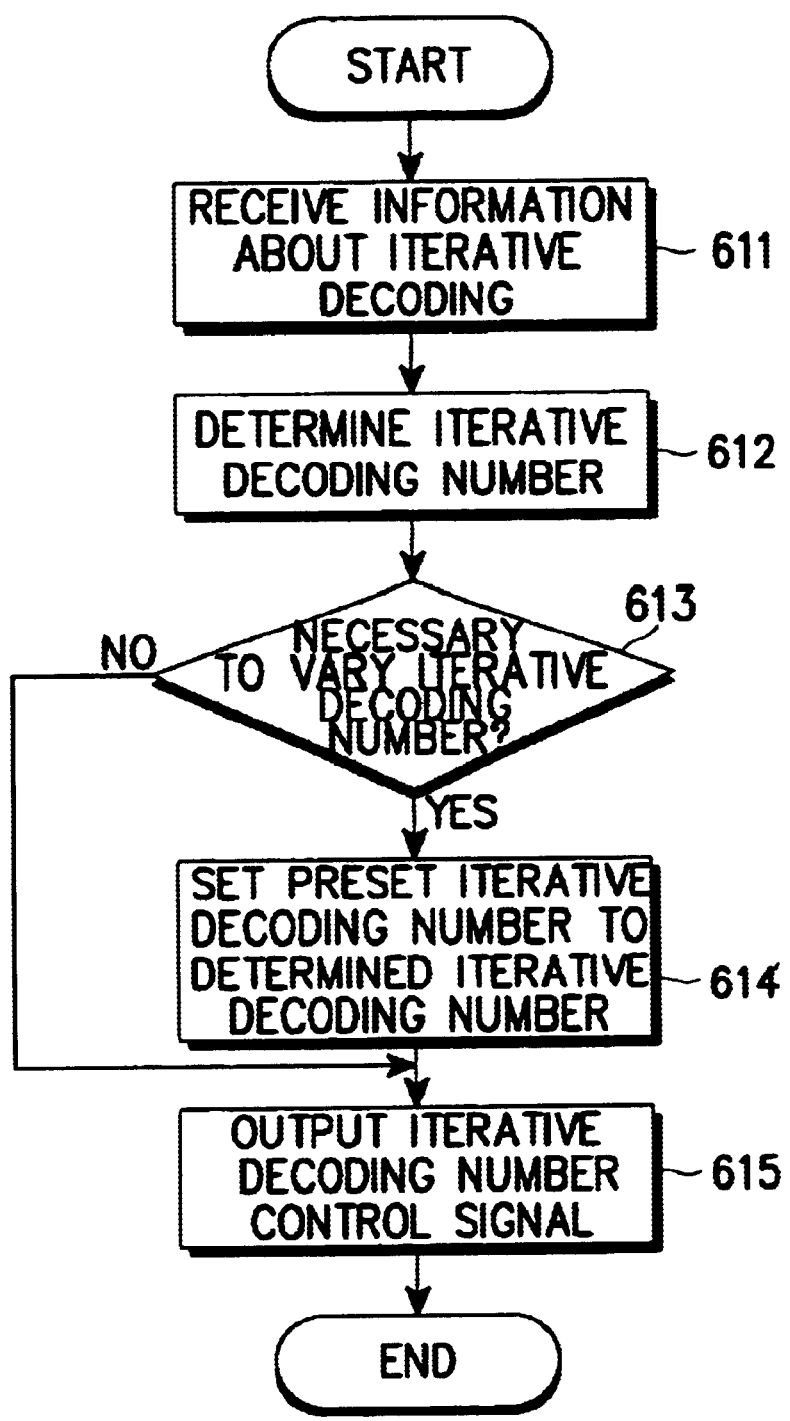
FIG. 6 is a flow chart illustrating a control process of an iterative decoding controller according to an embodiment of the present invention.

A description will be made as to an operation of the iterative decoding controllers 402 and 502 with reference to FIG. 6. The iterative decoding controllers 402 and 502 receive, at step 611, information about iterative decoding from the CPU 400 and 500, respectively. The information about the iterative decoding is determined by analyzing the message information about the service type, the data class, and the present channel condition. At step 612, the information about the iterative decoding is analyzed to determine the iterative decoding number. It is judged at step 613 whether it is necessary to vary the iterative decoding number by comparing the determined iterative decoding number with a threshold or a predetermined number. If it is judged that it is not necessary to vary the iterative decoding number, the iterative decoding controllers 402 and 502 output the iterative decoding number control signal in a first state to the soft-decision decoders 414 and 514, respectively, at step 615. Otherwise, when it is necessary to vary the iterative decoding number, the present iterative decoding number is varied to the determined iterative decoding number at step 614. Thereafter, a corresponding iterative decoding number control signal in a second state is applied to the soft-decision decoders 414 and 514 at step 615.

It is contemplated that CPU 400 and iterative decoding controllers 402 can be merged in one controller chip. It is also contemplated that CPU 500 and iterative decoding controller 502 can be merged in one controller chip.

Figure 7:
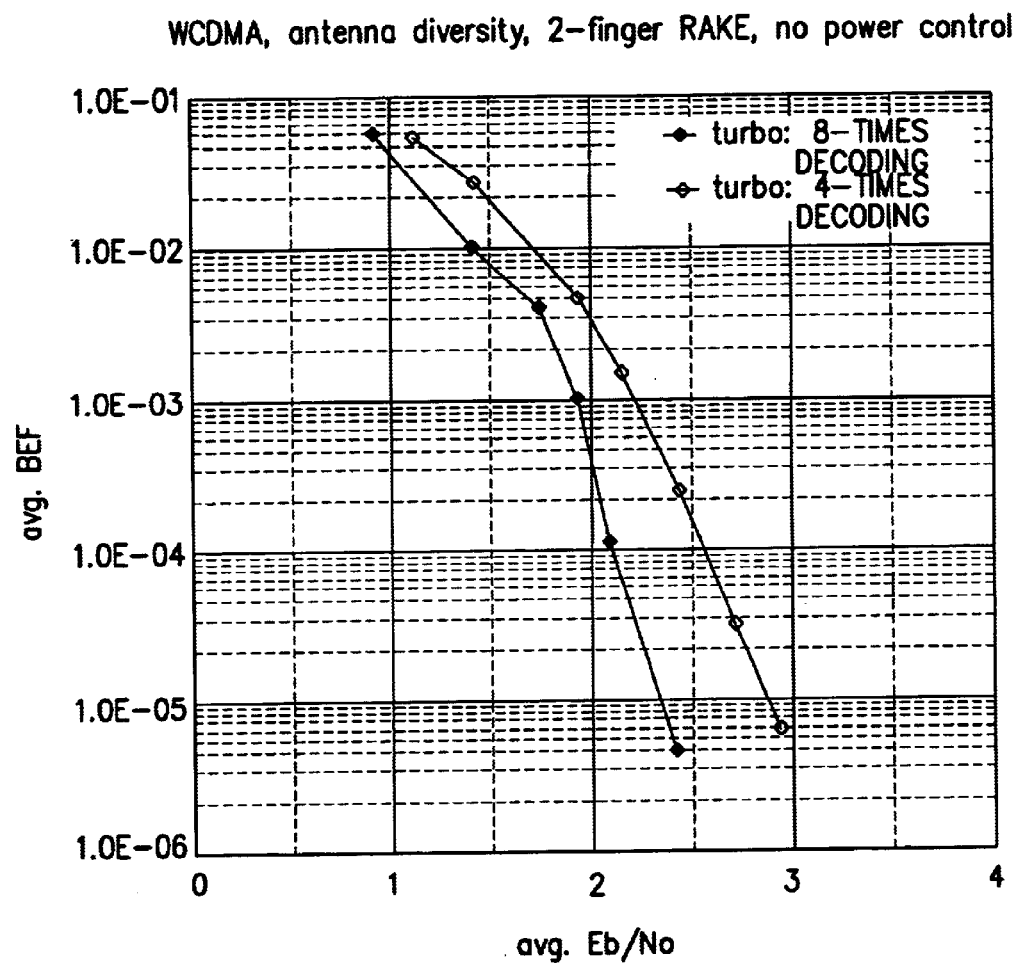
FIG. 7 is a graph illustrating a simulated result as a function of the iterative decoding number according to an embodiment of the present invention.

FIG. 7 is a graph illustrating a simulated result as a function of the iterative decoding number of the channel decoder. As shown in FIG. 7, there is a considerable difference in the bit error rate between 4-times iterative decoding and 8-times iterative decoding. To provide a service having a higher data class in the state where the iterative decoding number is initially set to 4, the iterative decoding number is increased to 8.

In the light of the foregoing descriptions, an efficiency of the turbo decoder can be increased by varying the iterative decoding number according to the service type, data class and channel condition.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A receiving device for a communication system, comprising:
   a message information receiver for receiving information about a message to be received;
   a transmission channel receiver for receiving the message;
   a controller for determining an iterative decoding number according to the message information received from the message information receiver; and
   a decoder for iteratively decoding the message received from the transmission channel according to the determined iterative decoding number.

2. The receiving device as claimed in claim 1, wherein the message information includes a class of received data.

3. The receiving device as claimed in claim 2, wherein the class includes a bit error rate (BER).

4. The receiving device as claimed in claim 3, wherein the controller increases the iterative decoding number if the BER is less than a predetermined number.

5. The receiving device as claimed in claim 2, wherein the class includes a permissible time delay.

6. The receiving device as claimed in claim 5, wherein the controller increases the iterative decoding number if the permissible time delay is greater than a predetermined number.

7. The receiving device as claimed in claim 1, wherein the message information includes a service type of the received data.

8. The receiving device as claimed in claim 7, wherein the controller decreases the iterative decoding number if the service type is a moving picture service.

9. The receiving device as claimed in claim 1, wherein the decoder is a soft-decision decoder.

10. The receiving device as claimed in claim 1, wherein the decoder is a MAP (Maximum A Posteriori Probability) decoder.

11. The receiving device as claimed in claim 1, wherein the decoder is a SOVA (Soft Output Viterbi Algorithm) decoder.

12. A receiving method for a communication system, comprising the steps of:
    receiving information about a message to be received;
    receiving the message through a channel;
    determining an iterative decoding number according to the information; and
    iteratively decoding the received message according to the determined iterative decoding number.

13. The receiving method as claimed in claim 12, wherein the message information includes a data class of the received data.

14. The receiving method as claimed in claim 13, further comprising the step of decreasing the iterative decoding number if the data class of the received data is a low data class.

15. The receiving method as claimed in claim 13, wherein the class includes a BER.

16. The receiving method as claimed in claim 13, further comprising the step of decreasing the iterative decoding number if the BER is greater than a predetermined number.

17. The receiving method as claimed in claim 13, wherein the data class includes a permissible time delay.

18. The receiving method as claimed in claim 17, further comprising the step of decreasing the iterative decoding number if the permissible time delay is less than a predetermined number.

19. The receiving method as claimed in claim 12, wherein the message information includes a service type of the received data.

20. The receiving method as claimed in claim 19, further comprising the step of decreasing the iterative decoding number if the service type is a moving picture service.

* * * * *